United States Patent
Seong

(10) Patent No.: US 8,498,153 B2
(45) Date of Patent: Jul. 30, 2013

(54) SEMICONDUCTOR MEMORY DEVICE AND METHOD OF OPERATING THE SAME

(75) Inventor: Jin Yong Seong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 61 days.

(21) Appl. No.: 13/151,678

(22) Filed: Jun. 2, 2011

(65) Prior Publication Data

US 2012/0008390 A1    Jan. 12, 2012

(30) Foreign Application Priority Data

Jul. 9, 2010 (KR) .................. 10-2010-0066514

(51) Int. Cl.
*G11C 11/34*   (2006.01)
*G11C 16/04*   (2006.01)
*G11C 16/06*   (2006.01)

(52) U.S. Cl.
USPC ............. 365/185.03; 365/185.09; 365/185.11

(58) Field of Classification Search
USPC ................... 365/185.09, 185.11, 185.03
See application file for complete search history.

(56) References Cited

U.S. PATENT DOCUMENTS

| | | | | |
|---|---|---|---|---|
| 7,042,772 B2 * | 5/2006 | Wang et al. | ............... | 365/189.09 |
| 7,447,066 B2 * | 11/2008 | Conley et al. | ............ | 365/185.03 |
| 7,733,697 B2 * | 6/2010 | Picca et al. | ............... | 365/185.09 |
| 8,199,574 B2 * | 6/2012 | Lee | ............................ | 365/185.09 |
| 8,266,503 B2 * | 9/2012 | Wood et al. | .................... | 714/773 |
| 2008/0192544 A1 * | 8/2008 | Berman et al. | ............ | 365/185.09 |
| 2009/0113115 A1 * | 4/2009 | Nazarian et al. | .............. | 711/103 |
| 2010/0235715 A1 * | 9/2010 | Thatcher et al. | ............... | 714/763 |
| 2010/0306583 A1 * | 12/2010 | Kim et al. | ......................... | 714/8 |

FOREIGN PATENT DOCUMENTS

KR   100783988   12/2007

* cited by examiner

*Primary Examiner* — Ly D Pham
(74) *Attorney, Agent, or Firm* — IP & T Group LLP

(57) ABSTRACT

A semiconductor memory device includes memory blocks each including a plurality of groups of memory cells programmable in multiple levels and a control circuit configured to make a determination of whether a specific memory block treated a bad block, from among the memory blocks, is programmable in a single level and to control the specific memory block according to a result of the determination so that the specific memory block is usable as a single level cell block.

8 Claims, 4 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0066514 filed on Jul. 9, 2010, the entire disclosure of which is incorporated by reference herein, is claimed.

BACKGROUND

Exemplary embodiments relate to a semiconductor memory device and a method of operating the same.

There is a growing demand for semiconductor memory devices which can electrically program and erase data and can retain the data even without the supply of power. In order to produce high-capacity memory devices capable of storing a large amount of data, techniques for the high integration of memory cells are being developed. For example, a NAND type memory device in which a plurality of memory cells are connected in series to form a cell string, a plurality of the cell strings forms a memory block, and a plurality of the memory blocks forms a memory cell array has been proposed.

The semiconductor memory device may employ a repair technique for using redundancy cell strings instead of cell strings including defective memory cells among the cell strings of a memory block.

However, the semiconductor memory device may include the limited number of redundancy cell strings. Therefore, if the number of defective cell strings is greater than the number of redundancy cell strings in one memory block, the memory block may not be used properly and may be discarded as an unusable bad block.

BRIEF SUMMARY

Exemplary embodiments relate to a semiconductor memory device and a method of operating the same, which are capable of using a memory block including defective multi-level cells. Even if the memory block is unusable in the operation of multi-level cells (e.g., a bad block), it may be used by designating the multi-level cells as single level cells as long as the multi-level cells can operate as single level cells.

A semiconductor memory device according to an aspect of the present disclosure includes memory blocks each including a plurality of groups of memory cells programmable in multiple levels and a control circuit configured to make a determination of whether a specific memory block treated a bad block, from among the memory blocks, is programmable in a single level and to control the specific memory block according to a result of the determination so that the specific memory block can be used as a single level cell block.

A method of operating the semiconductor memory device according to another aspect of this disclosure includes selecting one of word lines of a memory block and performing multi-level cell program and multi-level cell verification processes for the selected word line by repeatedly supplying a program voltage to memory cells of the selected word line up to a maximum number of times that the program voltage is to be applied, wherein the program voltage is increased by a step voltage each time that the program voltage is supplied compared to the previously supplied program voltage; determining whether a column to which the memory cell of the selected wore line is coupled is repairable if a threshold voltage of the memory cell is less than a set voltage after the program voltage is supplied for at least the maximum number of times; designating the memory block as a temporary bad block if the column is determined to be unrepairable as a result of the determination and performing a single level cell program and a single level cell verification process for each of word lines of the memory block, respectively by supplying a single level cell verification voltage to a selected word line, wherein the single level cell verification voltage is used to verify whether the memory cell is programmed in a single level; and if results of the single level cell verification of all word lines are pass, designating the memory block as a single level cell block in which memory cells of the memory block are used as single level.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
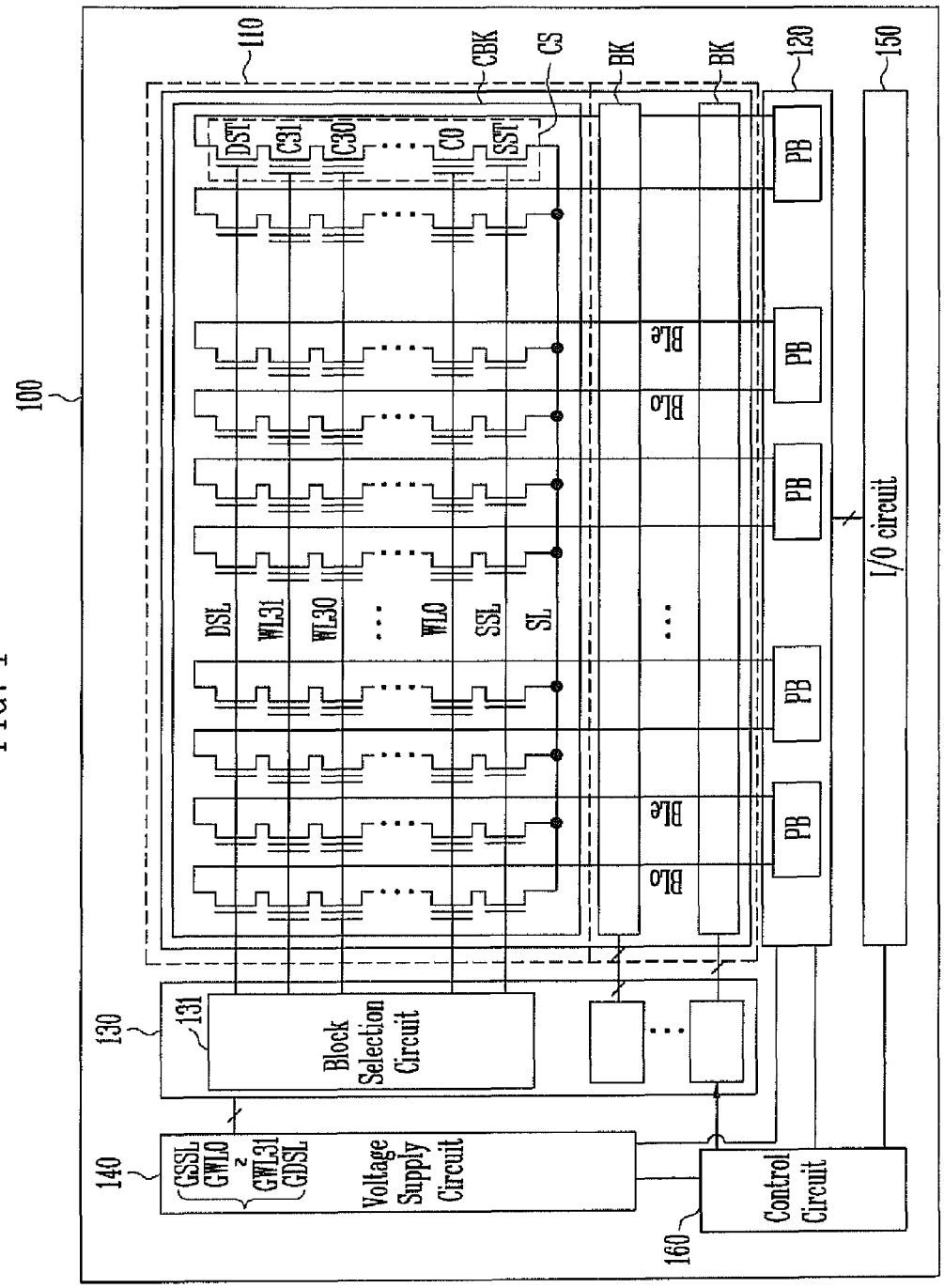
FIG. 1 is a diagram illustrating a semiconductor memory device according to an exemplary embodiment of this disclosure.

FIG. 1 is a diagram illustrating a semiconductor memory device according to an exemplary embodiment of this disclosure.

Referring to FIG. 1, the semiconductor memory device 100 includes a memory cell array 110, a page buffer group 120, an X decoder 130, an I/O circuit 150, a voltage supply circuit 140, and a control circuit 160. Although the semiconductor memory device 100 of FIG. 1 is illustrated to have one plane, the semiconductor memory device 100 may include two or more planes and include the memory cell array 110, the X decoder 130, and the page buffer group 120 for every plane.

The memory cell array 100 includes a plurality of memory blocks BK. Each of the memory blocks BK includes a plurality of cell strings CS. Each of the cell strings includes $0^{th}$ to $31^{st}$ memory cells C0 to C31 coupled in series between a drain select transistor DST and a source select transistor SST.

The gates of the drain select transistors DST are coupled to a drain select line DSL, and the gates of the source select transistors SST are coupled to a source select line SSL. The gates of the $0^{th}$ to $31^{st}$ memory cells are coupled to $0^{th}$ to $31^{st}$ word lines WL0 to WL31, respectively.

The drains of the drain select transistors DST are coupled to respective bit lines. The bit lines are classified into an even bit line BLe and an odd bit line BLo. The sources of the source select transistors SST are coupled to a common source line SL.

The page buffer group 120 includes a plurality of page buffers PB operating for a program or read operation. Each of the page buffers PB is coupled to a pair of the even bit line BLe and the odd bit line BLo.

The I/O circuit 150 transmits data between the page buffer group 120 and the outside of the semiconductor memory device.

The X decoder 130 includes a plurality of block selection circuits 131. Each of the block selection circuits 131 is coupled to the memory block BK.

The block selection circuit 131 couples the drain select line DSL, the source select line SSL, and the $0^{th}$ to $31^{st}$ word lines WL0 to WL31 of a memory block BK, coupled thereto, to the global drain select line GDSL, the global source select line GSSL, and the $0^{th}$ to $31^{st}$ global word lines GWL0 to GWL31 of the voltage supply circuit 140, respectively, in response to a control signal generated by the control circuit 160.

The voltage supply circuit 140 generates operation voltages and supplies the operation voltages to the global lines GSSL, GDSL, GWL0 to GWL31 in response to a control signal generated by the control circuit 160.

The control circuit 160 generates control signals for controlling the operations of the page buffer group 120, the X decoder 130, the I/O circuit 150, and the voltage supply circuit 140 of the semiconductor memory device 100.

Furthermore, the control circuit 160 controls a repair operation for replacing a defective cell string, among the cell strings of the memory block, with a redundancy cell string so that the repair operation is performed. Repair information is stored in a CAM block CBK.

When the number of defective cell strings within a memory block exceeds a set number of the redundancy cell strings, the defective cell strings may not be replaced with the redundancy cell strings. Accordingly, the control logic 160 determines whether the memory cells of the memory block can be used as single level cells and discards the memory block as a bad block or designates the memory cells of the memory block as single level cells so that the memory block can be used, depending on a result of the determination.

Figure 2:
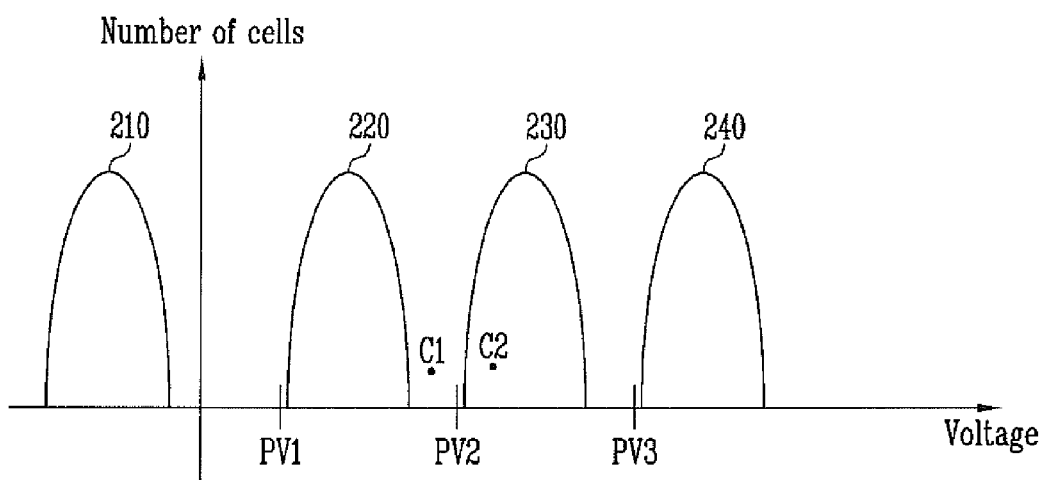
FIG. 2 is a diagram illustrating threshold voltage distributions of memory cells shown in FIG. 1 when operating as multi-level cells.

FIG. 2 is a diagram illustrating threshold voltage distributions of the memory cells shown in FIG. 1 when operating as multi-level cells.

Referring to FIG. 2, when memory cells having a threshold voltage of 0 V (volt) or less at an erase state 210 are programmed, the threshold voltages of the memory cells are shifted to belong to one of first to third threshold voltage distributions 220 to 240.

The memory cells of the semiconductor memory device of FIG. 1 may be programmed according to an Increment Step Pulse Program (ISPP) method.

More particularly, the program is performed by supplying a program voltage to the gates of the memory cells. Here, the program voltage rises in steps by increasing the program voltage with a step voltage at each step whenever it is supplied to the gates of the memory cells. After the program is performed, whether the program has been completed is checked using verification voltages PV1, PV2, and PV3. Here, the maximum number of times that the program voltage is supplied may be set. Memory cells that have not been programmed even after the maximum number of times that the program pulses have been supplied are determined to as program-fail memory cells that were not properly programmed.

For example, first and second memory cells C1 and C2 are illustrated in FIG. 2.

If the threshold voltages of the first and second memory cells C1, C2 should be shifted to belong to the second threshold voltage distribution 230 through a program, the threshold voltage of the second memory cell C2 has properly been shifted to belong to the second threshold voltage distribution 230.

Although the threshold voltage of the first memory cell C1 has risen from the distribution of the erase state 210, the threshold voltage of the first memory cell C1 has not been shifted to belong to the second threshold voltage distribution 230 even after the program voltage is supplied the maximum number of times.

Here, the control circuit 160 determines that a cell string to which the first memory cell C1 belongs is defective and performs a repair operation.

If the number of redundant cell strings is 10 and the number of defective cell strings of a memory block is 11, the control circuit 160 discards the memory block as a bad block that may not be used.

The control circuit 160 stores information about a bad block in the CAM block CBK or in a fuse circuit (not shown) and controls the bad block so that the bad block is not selected in subsequent operations.

Meanwhile, the first memory cell C1 of FIG. 2 may be a slow cell that is slowly programmed, rather than a defective memory cell that is not properly programmed. That is, the first memory cell C1 is not such a memory cell as not being programmed at all although it has not been programmed with a desired threshold voltage belonging to the second threshold voltage distribution 230 through a predetermined number of supplying of the program voltage.

Accordingly, when a memory block BK is discarded as a bad block, the control circuit 160 determines whether the memory cells of a defective cell string are slow cells like the first memory cell C1 or memory cells that have never been programmed.

If the memory cells of the defective cell string in the memory block BK are slow cells, the control circuit 160 controls the memory block BK so that the memory cells of the memory block BK can be used as single level cells.

Figure 3:
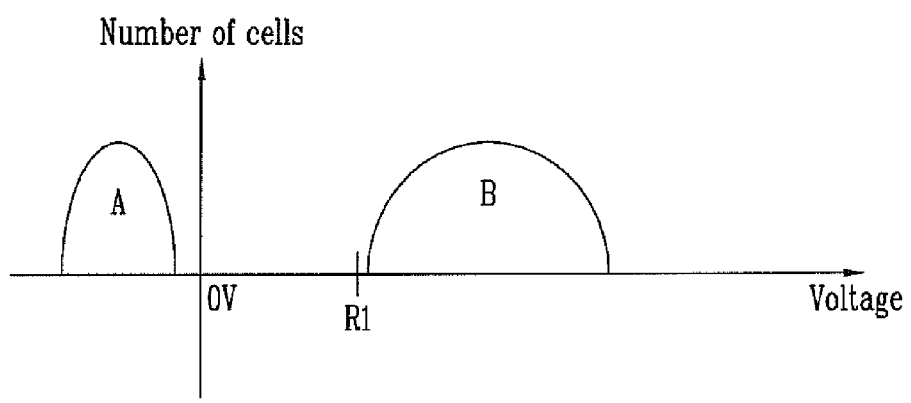
FIG. 3 is a diagram illustrating the threshold voltage distributions of memory cells shown in FIG. 1 when operating as single level cells.

FIG. 3 is a diagram illustrating the threshold voltage distributions of memory cells shown in FIG. 1 when operating as single level cells.

Referring to FIG. 3, when memory cells at an erase state A are programmed to operate as single level cells, the threshold voltages of the memory cells are shifted to be a verification voltage R1 or higher (B). The verification voltage R1 may be set to a voltage level between 0 V and PV1 of FIG. 2 by taking a read operation margin into consideration.

That is, the single level cells are classified into programmed cells and erased cells on the basis of the verification voltage R1. Therefore, the single level cells may be classified into programmed cells and erased cells more easily than the multi-level cells, and there is a less probability that the programmed and erased state of the single level cells, i.e., data, are erroneously read, compared to the multi-level cells.

Accordingly, slow cells of a memory block, which are defective as multi-level cells, may be used as single level cells.

Figure 4A:
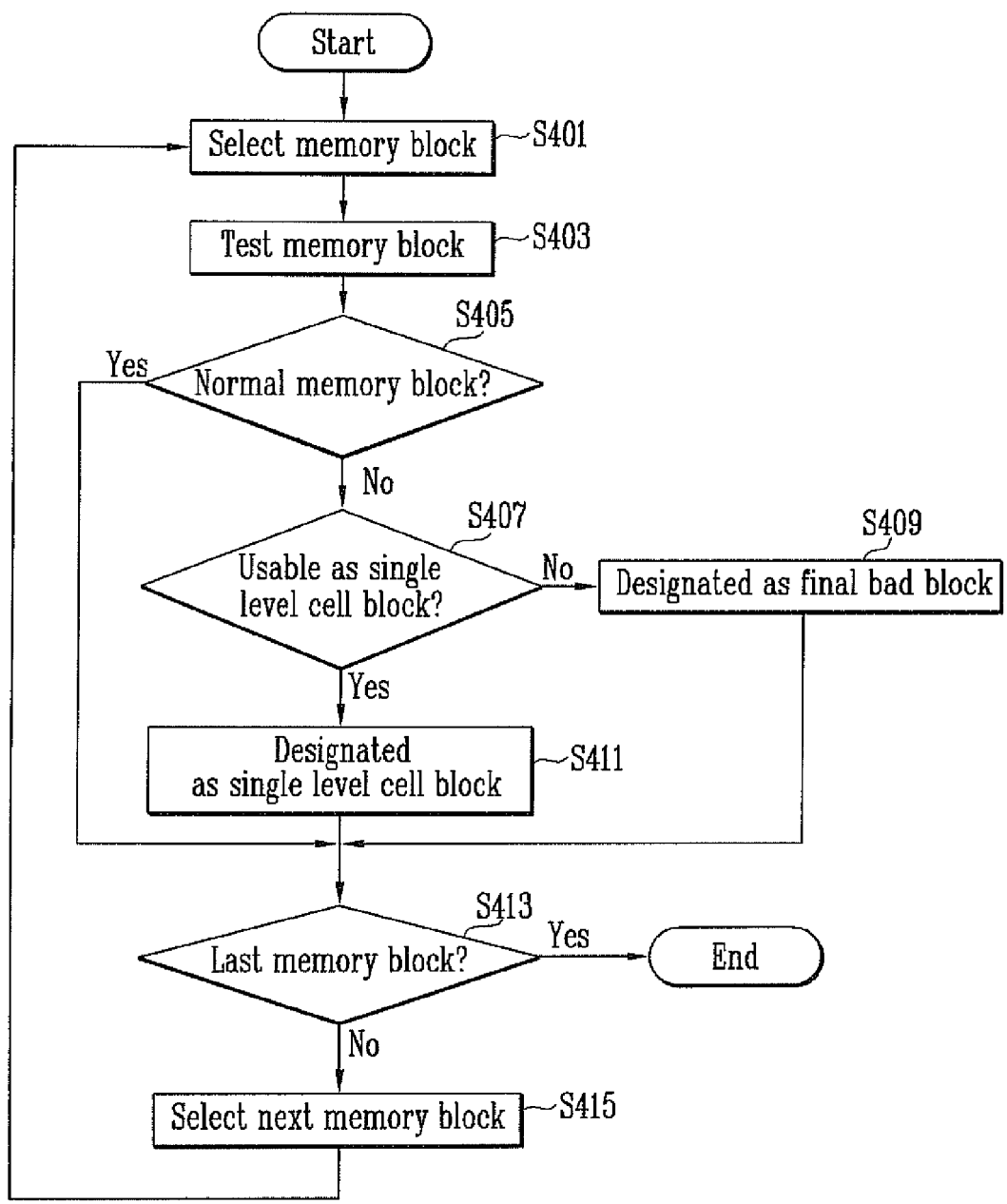
FIG. 4A is a flowchart illustrating an operation method according to an exemplary embodiment of this disclosure.
Figure 4B:
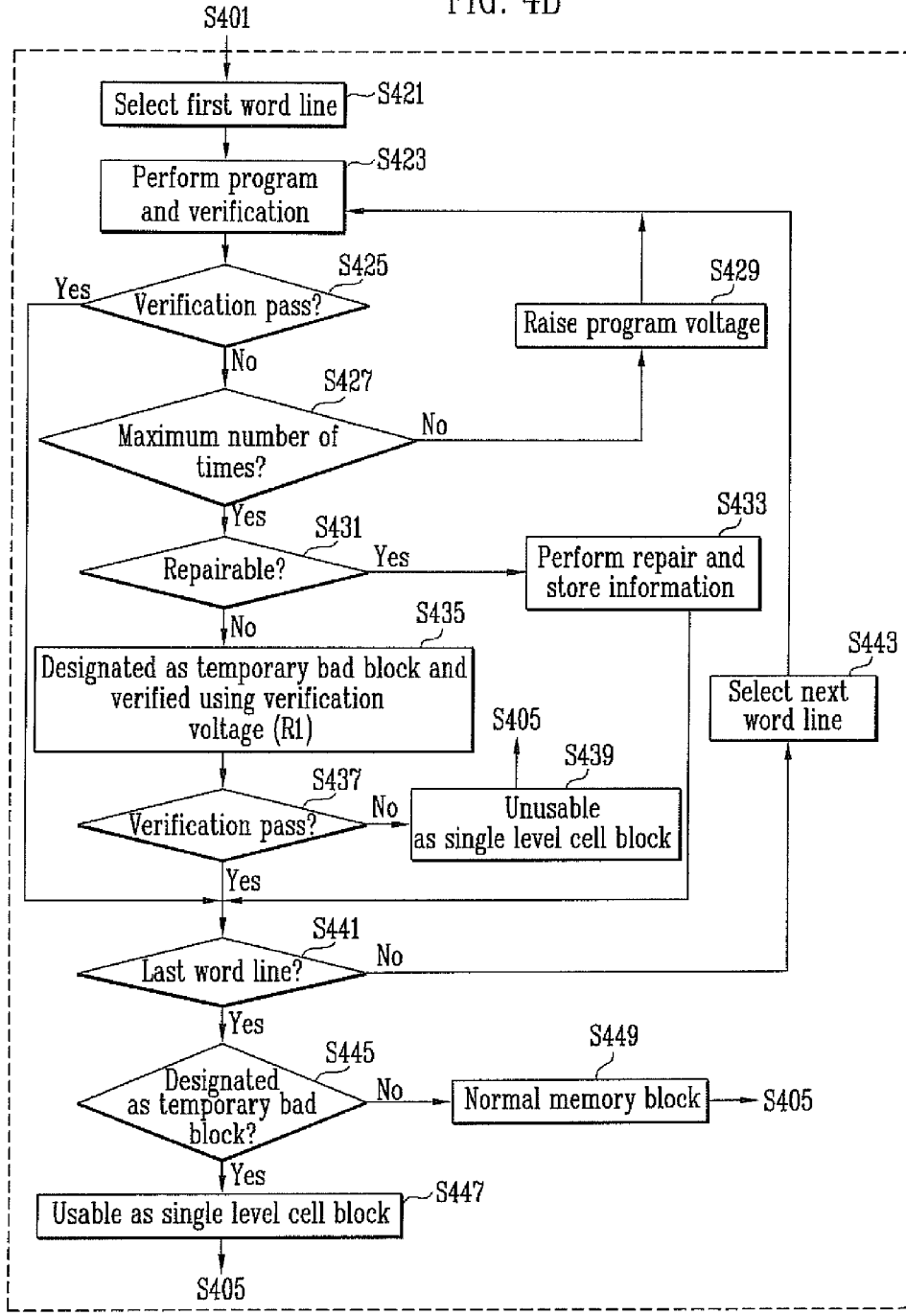
FIG. 4B is a detailed flowchart illustrating a memory block test method of FIG. 4A.

FIG. 4A is a flowchart illustrating an operation method according to an exemplary embodiment of this disclosure, and FIG. 4B is a detailed flowchart illustrating a memory block test method of FIG. 4A.

FIG. 4A shows a block test process in order to check whether there is a bad block among memory blocks in a process of manufacturing the semiconductor memory device 100. Here, the block test operation may be performed using an additional test apparatus or may be performed in the control circuit 160. In the embodiment of this disclosure, the block test operation is performed in the control circuit 160.

Referring to FIG. 4A, when the block test operation starts, the control circuit 160 selects one memory block BK at step S401 and tests the selected memory block BK at step S403. The operation at step S403 will be described in detail later with reference to FIG. 4B.

It is determined whether the memory block BK is a normal memory block based on a result of the block test at step S405. If, as a result of the determination, the memory block BK is determined not to be a normal memory block, it is determined whether the memory block BK can be used as a single level cell block at step S407.

If, as a result of the determination at step S407, the memory block BK can be used as a single level cell block, the memory block BK is designated as the single level cell block at step S411.

If, as a result of the determination at step S407, the memory block BK may not be used as a single level cell block, the memory block BK is designated as a final bad block at step S409.

The block address of the memory block BK designated as the final bad block is additionally stored so that the memory block BK is no longer used.

Furthermore, the block address of a memory block that is designated as a single level cell block is also stored so that the memory cells of the memory block can be operated as single level cells when data is stored in the memory cells.

It is then determined whether the block test operation has been completed up to the last memory block at step S413.

If, as a result of the determination at step S413, the block test operation is determined not to have been completed up to the last memory block, the next memory block BK is selected at step S415.

Meanwhile, the block test operation of step S403 is described as follows.

Referring to FIG. 4B, when the memory block BK is selected for the block test operation, the control circuit 160 first selects the $0^{th}$ word line WL0 at step S421 and performs program and verification processes at step S423. When the program and verification processes are performed, test data randomly determined for the block test may be used as data to be programmed.

Since the memory cells of the memory block BK are operated as multi-level cells, verification voltages PV1, PV2, and PV3 are used in the verification process.

It is determined whether the result of the verification process indicates a pass at step S425. If, as a result of the determination, the selected word line fails to pass the verification process, it is determined whether the program voltage has been supplied a maximum number of times at step S427.

If, as a result of the determination at step S427, the program voltage is determined not to have been supplied the maximum number of times, a program voltage is raised at step S429, and the program and verification processes are performed again at step S423.

If, as a result of the determination at step S427, the program voltage is determined to have been supplied for the maximum number of times, some of memory cells coupled to the selected word line are determined to be defective.

Accordingly, cell strings including the defective memory cells are to be repaired. To this end, it is first determined whether there are replaceable redundancy cell strings at step S431. If, as a result of the determination, the replaceable redundancy cell strings are determined to exist, repair operation is performed and information about a column address on which the repair operation has been performed is stored at step S433.

If, as a result of the determination at step S431, the replaceable redundancy cell strings are determined not to exist, the memory block BK is designated as a temporary bad block and a verification process using the verification voltage R1 is then performed on the selected word line at step S435. The verification voltage R1 is used when memory cells are programmed as single level cells.

It is then determined whether the result of the verification process using the verification voltage R1 is a pass at step S437. If, as a result of the determination at step S437, the selected world line is determined to pass the verification process using the verification voltage R1, it is determined whether the program and verification processes have been performed up to the last word line at step S441.

If, as a result of the determination at step S441, the program and verification processes are determined to have been performed up to the last word line, it is determined whether the memory block BK is designated as a temporary bad block at step S445.

If, as a result of the determination at step S445, the memory block BK is determined to have been designated as a temporary bad block, the memory block BK is designated as a single level cell block at step S447 because all the word lines of the memory block BK have been determined to be able to used as single level cells at the steps S435 and S437.

If, as a result of the determination at step S445, the memory block BK is determined not to have been designated as a temporary bad block, the memory block BK is considered as a normal memory block at step S449 because the memory block BK needs not to be used as a single level cell block and can be used as a normal memory block.

Meanwhile, if, as a result of the determination at step S441, the program and verification processes are determined not to have been performed up to the last word line, the next word line is selected at step S443 and the program and verification processes are performed again at step S423.

Meanwhile, if, as a result of the determination at step S437, the selected word line fails to pass the verification process using the verification voltage R1, the memory block BK is determined to be unusable as a single level cell block at step S439, and the block test is no longer performed.

After the block test operation is performed, the memory block BK may be designated as a final bad block or a single level cell block by checking the designation result of step S439, step S447, or step S449 at steps S405 and 405 of FIG. 4A.

The control circuit 160 may change some of the page addresses of the memory block BK to have a preset pattern form and store the changed page addresses in order to distinguish memory blocks used as single level cell blocks.

Through the above operation, a memory block discarded as a bad block because of slow cells can be used as a single level cell block. Accordingly, the data storage capacity of the semiconductor memory device 100 can be increased.

The address of a single level cell block and the address of a final bad block are separately stored in the CAM block CBK. When the control circuit 160 controls the operation of the semiconductor memory device 100, the control logic 160 may load the address of the single level cell block and the address of the final bad block in the form of a mapping table and use them.

In accordance with the semiconductor memory device and the method of operating the same according to the exemplary embodiment of this disclosure, if a memory block including multi-level cells is discarded as a bad block owing to a slow cell, the multi-level cells may be designated as single level cells by determining whether the slow cell can operate as the single level cell. Accordingly, the number of memory blocks discarded as bad blocks can be reduced, and the data storage capacity can be increased.

What is claimed is:

1. A semiconductor memory device, comprising:
memory blocks each comprising a plurality of groups of memory cells programmable in multiple levels; and
a control circuit configured to make a determination of whether a specific memory block treated as a bad block, from among the memory blocks, is programmable in a single level by supplying a single level cell verification voltage to memory cells of the specific memory block and to control the specific memory block according to a result of the determination so that the specific memory block is usable as a single level cell block,
wherein the control circuit is configured to control address information about the single level cell block to be stored in a memory block designated as a CAM block among the memory blocks.

2. The semiconductor memory device of claim 1, wherein the memory block is used as the single level cell block other than a multi-level cell block if, when a number of the groups which have at least one defective memory cell exceed a number of redundancy groups, the defective memory cell is determined to be programmable with the single level.

3. The semiconductor memory device of claim 1, further comprising a peripheral circuit configured to store data in the memory cells of the memory blocks and read data stored in the memory cells of the memory blocks.

4. The semiconductor memory device of claim 1, wherein the control circuit is configured to store a mapping table having address information about the single level cell block in additional storage unit.

5. A method of operating a semiconductor memory device, the method comprising:
selecting one of word lines of a memory block and performing multi-level cell program and multi-level cell verification processes for the selected word line by repeatedly supplying a program voltage to memory cells of the selected word line up to a maximum number of times that the program voltage is to be applied, wherein the program voltage is increased by a step voltage each time that the program voltage is supplied compared to the previously supplied program voltage;
determining whether a column to which the memory cell of the selected wore line is coupled is repairable if a threshold voltage of the memory cell is less than a set voltage after the program voltage is supplied for at least the maximum number of times;
designating the memory block as a temporary bad block if the column is determined to be unrepairable as a result of the determination and performing a single level cell program and a single level cell verification process for each of word lines of the memory block, respectively by supplying a single level cell verification voltage to a selected word line, wherein the single level cell verification voltage is used to verify whether the memory cell is programmed in a single level; and
if results of the single level cell verification of all word lines are a pass, designating the memory block as a single level cell block in which memory cells of the memory block are used as single level cells,
wherein if at least one word line is not a pass in the single level verification process, the memory block is designated as a bad block.

6. The method of claim 5, wherein the determining of whether the column is repairable comprises, if there is a redundancy column usable instead of the column, replacing the column with the redundancy column and storing an address of the column and an address of the redundancy column as repair address information.

7. The method of claim 6, wherein a block address of the memory block designated as the single level cell block is stored together with the repair address information.

8. The method of claim 5, wherein a block address of the memory block, designated as the single level cell block, are set as a single level cell block address by changing some bits of the block address to have a set pattern and information about the block address and the single level cell block address is stored in a mapping table form.

* * * * *